US010686437B2

(12) United States Patent
Chauhan

(10) Patent No.: US 10,686,437 B2
(45) Date of Patent: Jun. 16, 2020

(54) SCHEME TO GUARANTEE CLEAN RESET OUTPUT AT SUPPLY POWER-UP

(71) Applicant: TEXAS INSTRUMENTS INCORPORATED, Dallas, TX (US)

(72) Inventor: Rajat Chauhan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/227,636

(22) Filed: Dec. 20, 2018

(65) Prior Publication Data

US 2020/0021285 A1 Jan. 16, 2020

(30) Foreign Application Priority Data

Jul. 12, 2018 (IN) .............................. 201841025995

(51) Int. Cl.
*H03L 7/00* (2006.01)
*H03K 17/081* (2006.01)
*B60R 16/03* (2006.01)
*H02M 7/06* (2006.01)

(52) U.S. Cl.
CPC ........ *H03K 17/08104* (2013.01); *B60R 16/03* (2013.01); *H02M 7/06* (2013.01)

(58) Field of Classification Search
CPC ................. H03K 17/223; H03K 17/22; H03K 3/356008; G06F 1/24; G11C 5/143

USPC ................................... 327/77, 142, 143, 198
See application file for complete search history.

(56) References Cited

U.S. PATENT DOCUMENTS

| 7,679,412 B2 * | 3/2010 | Ogiwara | ................. | G11C 5/143 |
| | | | | 327/143 |
| 8,797,072 B2 * | 8/2014 | Shrivastava | ........... | G01R 21/00 |
| | | | | 327/143 |
| 2007/0170962 A1 * | 7/2007 | Wu | ........................ | H03K 17/22 |
| | | | | 327/143 |

* cited by examiner

*Primary Examiner* — Anh Q Tra
(74) *Attorney, Agent, or Firm* — Michael A. Davis, Jr.; Charles A. Brill; Frank D. Cimino

(57) ABSTRACT

A circuit includes a first transistor including first and second current terminals. The first current terminal couples to a supply voltage node. A second transistor includes a second control input and third and fourth current terminals. The third current terminal couples to the second current terminal at an output node and the fourth current terminal couples to a ground node. A third transistor includes a third control input and fifth and sixth current terminals. The fifth current terminal couples to the output node and the sixth current terminal couples to the ground node. A fourth transistor includes a fourth control input and seventh and eighth current terminals. The eighth current terminal couples to the ground node and the seventh current terminal couples to the third control input. An inverter having an input coupled to the second control input and an output coupled to the fourth control input.

14 Claims, 6 Drawing Sheets

SCHEME TO GUARANTEE CLEAN RESET OUTPUT AT SUPPLY POWER-UP

RELATED APPLICATIONS

This application claims priority to an India Provisional Application No. 201841025995, filed Jul. 12, 2018, which is hereby incorporated by reference.

BACKGROUND

Many electronic systems include a power supply that delivers electrical power to one or more loads. When the system is initially powered on, the supply voltage generally ramps up from ground to a predefined voltage level (e.g., 3V, 5V, 10V, etc.). During the increase of the supply voltage during the power-on phase, loads that are connected to the power supply receive a steadily increasing voltage level on their supply inputs. Some loads, however, may be in indeterminate states until the magnitude of the supply voltage reaches a certain level.

SUMMARY

In some examples, a circuit includes a first transistor including first and second current terminals. The first current terminal couples to a supply voltage node. A second transistor includes a second control input and third and fourth current terminals. The third current terminal couples to the second current terminal at an output node and the fourth current terminal couples to a ground node. A third transistor includes a third control input and fifth and sixth current terminals. The fifth current terminal couples to the output node and the sixth current terminal couples to the ground node. A fourth transistor includes a fourth control input and seventh and eighth current terminals. The eighth current terminal couples to the ground node and the seventh current terminal couples to the third control input. An inverter having an input connected to the second control input and an output coupled to the fourth control input.

BRIEF DESCRIPTION OF THE DRAWINGS

For a detailed description of various examples, reference will now be made to the accompanying drawings in which.

DETAILED DESCRIPTION

Figure 1:
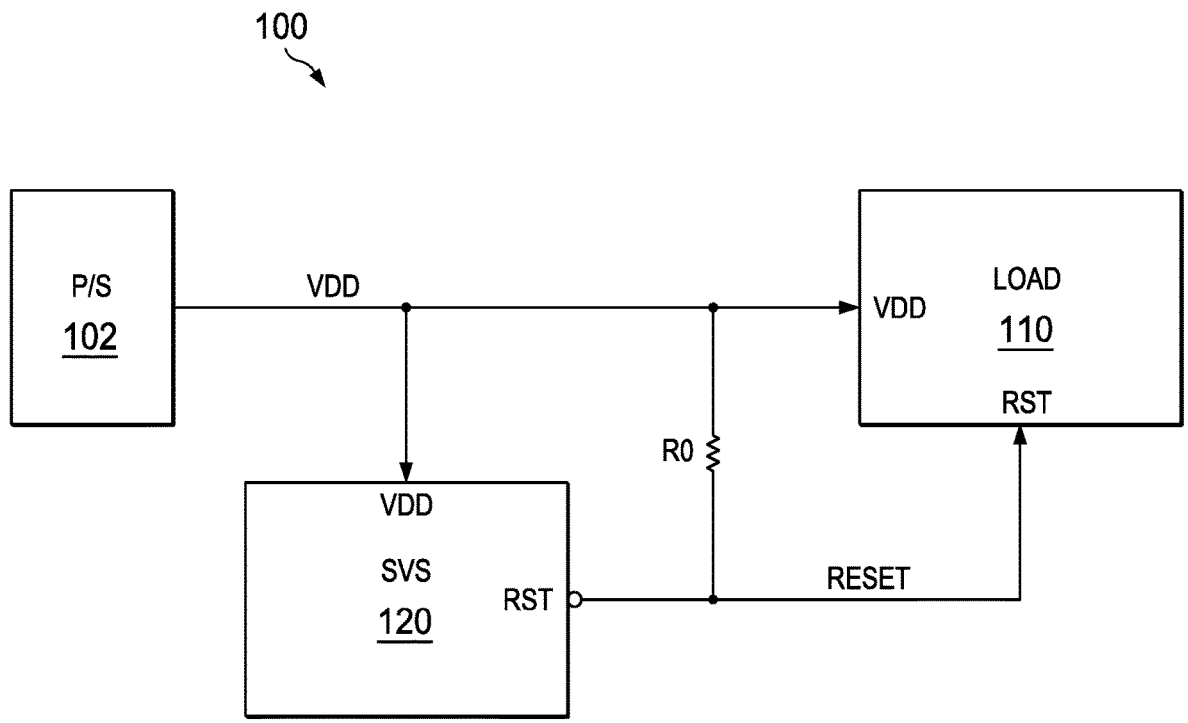
FIG. 1 is a system diagram of a system including a supply voltage supervisor coupled to a load and to a power supply.

FIG. 1 shows a system including a power supply 102, a load 110, and a supply voltage supervisor (SVS) 120. The power supply 102 supplies an operating voltage (VDD) to the load 110. Although one load 110 is shown in the example of FIG. 1, additional loads can be included in other examples. The load 110 may comprise any type of electrical device such as a microprocessor, a solid-state circuit breaker, etc. In one application, the load 110 may be used for regulating power supply in infotainment systems in automobiles.

The load 110 includes a reset input which can be a digital input that is controlled by the SVS 120. With the reset input of the load 110 forced to a first logic state (e.g., logic low), the load 110 is maintained in a reset state, thereby being prevented from performing its runtime functions. For example, if the load 110 is a microprocessor, the microprocessor is suspended from executing any operating system or other executable code. The SVS 120 monitors the magnitude of VDD. When the SVS 120 determines that VDD has reached a predetermined threshold during the power-on event (e.g., 80% of its final value), the SVS 120 asserts the reset input of the load 110 to second logic state (e.g., logic high). The load 110 responds to the change in the reset input by exiting the reset state and performing its runtime duties. A pull-up resistor R0 is coupled between the reset line and VDD. R0 is connected to the drain of an output transistor within the SVS 120.

Figure 2:
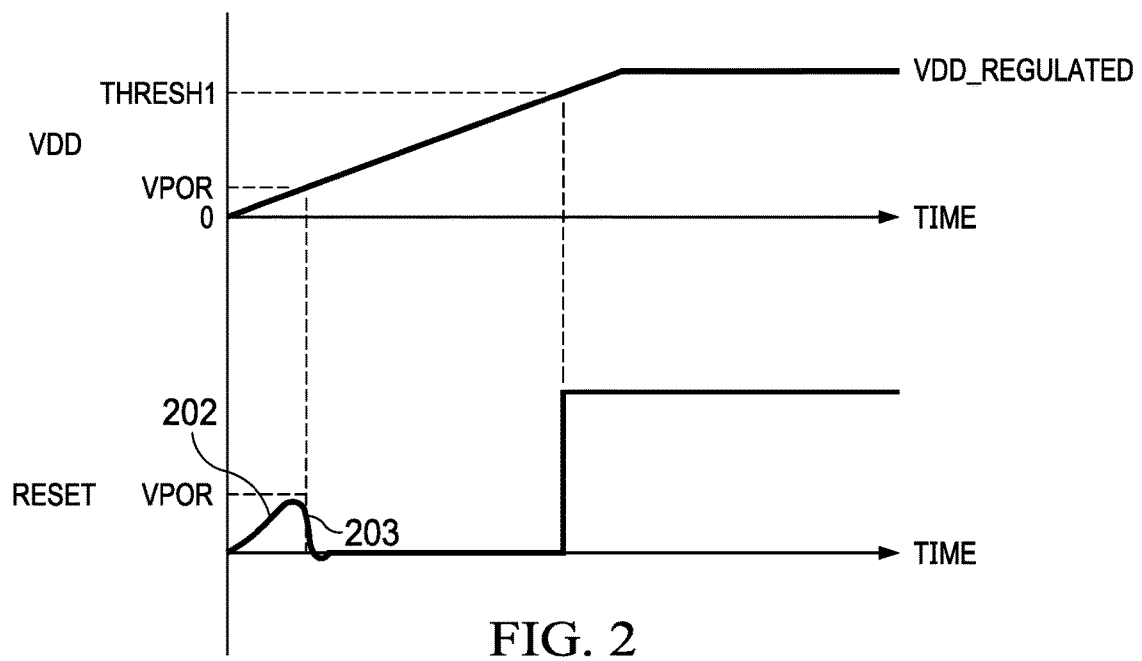
FIG. 2 illustrates waveforms during a power-on event of a supply voltage and a reset output of the supply voltage supervisor.

FIG. 2 illustrates an example of the transient behavior of VDD during a power-on event. As shown, VDD ramps up from about 0V to its regulated value designated in FIG. 2 as VDD_REGULATED. The RESET signal generated by the SVS 120 and provided to the load 110 is also shown. Initially, VDD is too low to even permit the SVS 120 to perform is task of pulling RESET low. At that low level of VDD, the reset output from the SVS generally tracks the upward progression of VDD due to R0 and parasitic capacitance coupling between the VDD input of the load 110 and the reset output of the SVS 120. FIG. 2 shows RESET increasing at 202. Once VDD reaches a sufficiently high voltage for the SVS 120 to bring RESET low, RESET is actively forced low at 203 and RESET remains low until VDD reaches a threshold (THRESH1) which may be, for example, 80% of VDD_REGULATED. At that point, the SVS 120 forces RESET high.

Figures 3, 4:
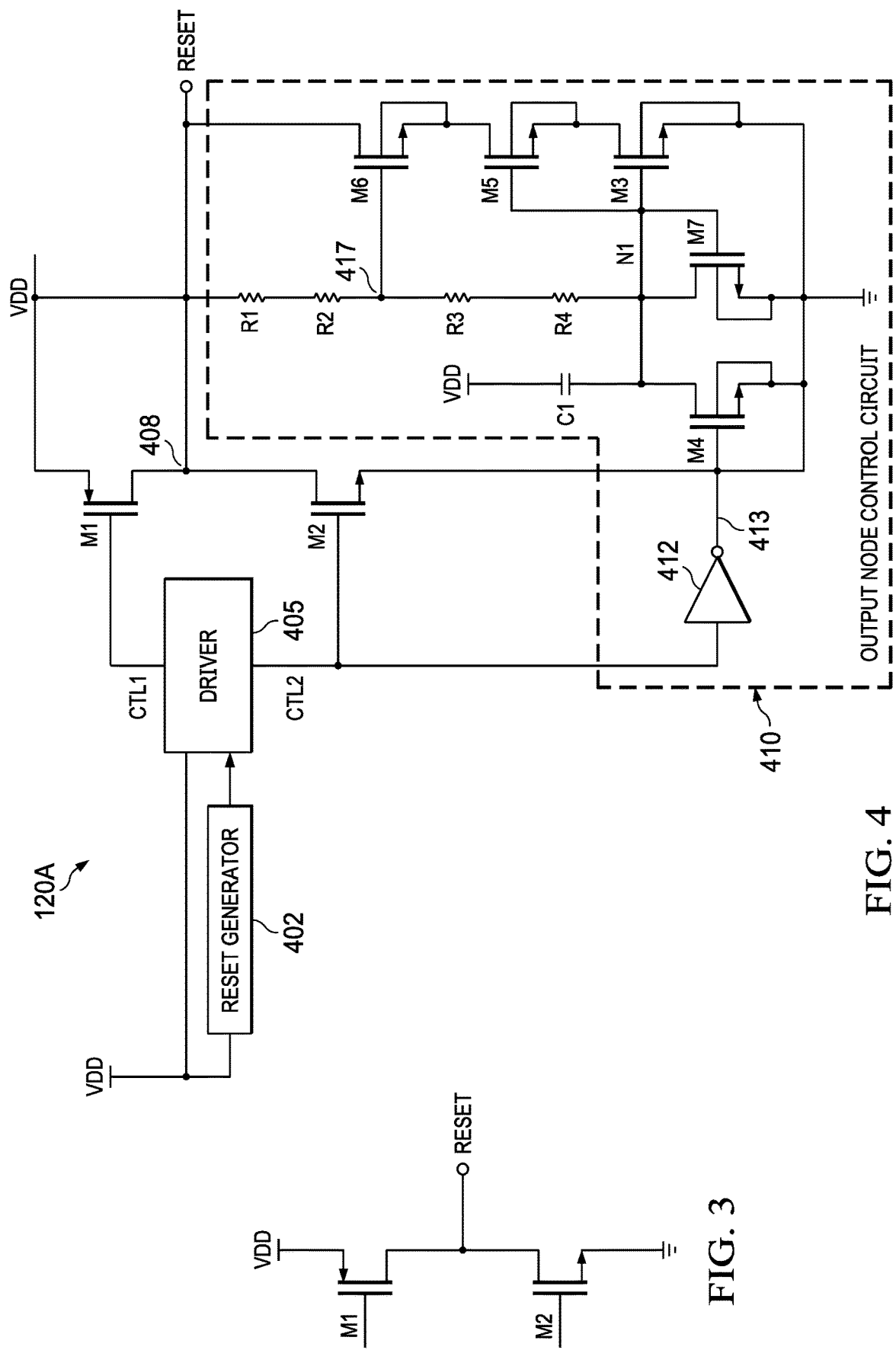
FIG. 3 shows a possible circuit implementation of a portion of the supply voltage supervisor.
FIG. 4 shows another circuit of a portion of the supply voltage supervisor.

One way for the SVS 120 to drive the RESET signal is shown in FIG. 3. Transistors M1 and M2 are coupled together in a push-pull configuration in which the RESET signal (which is the voltage on the node interconnecting M1 and M2) is pulled low when M2 is on (and M1 is off) and is forced high when M1 is on (and M2 is off). To turn M2 on (and thus to pull RESET low) requires the gate-to-source voltage on M2 to be greater than the threshold voltage of M2. In some implementations, the VDD_REGULATED voltage may be relatively high (e.g., 10V), which may mean that M1 and M2 are implemented as drain extended metal oxide semiconductor (DEMOS) field effect transistors. DEMOS transistors can support higher voltages, such as 10V at their drain terminals. However, DEMOS transistors may have threshold voltages around 1V. That means that M2 will not be turned on until VDD reaches at least 1V, and until M2 turns on, RESET may continue to track upward at 202 in FIG. 2.

Power-on reset voltage (VPOR) is a parameter that specifies the minimum supply voltage necessary for the internal circuitry of a supply voltage supervisor to actively control RESET as the supply voltage increases. VPOR is the minimum supply voltage that can turn on an output transistor of the supply voltage supervisor to control RESETVPOR is illustrated in FIG. 2. The SVS 120 guarantees a maximum VPOR of a stated value. Some applications benefit from VPOR being relatively low to avoid a false reset triggering of the load 110. That is, if VPOR were too high, then the load 110 might interpret the initial increase in RESET (shown at 202 in FIG. 2), before VDD is high enough for the SVS 120 can actively pull RESET low, as a logic high value thereby causing the load to exit its reset state before VDD is at a sufficiently high value. Some applications, for example, may benefit from a low VPOR, such as 0.3V, meaning that, while RESET may increase above 0V in its un-asserted state during the initial portion of the power-on event, the SVS 120 ensures that RESET will be kept below 0.3V until VDD has reached THRESH1. The threshold voltage of a DEMOS transistor is typically greater than 0.3V. Accordingly, the implementation shown in FIG. 3 to drive the RESET signal will be inadequate as it becomes increasingly desirable to have a lower VPOR voltage level.

The SVS disclosed herein permits a lower VPOR voltage to be guaranteed that would have been the case with, for example, the circuit of FIG. 3. The disclosed SVS includes a first transistor coupled in series with a second transistor thereby defining a reset output node between the first and second transistors. An output node control circuit is included and is coupled to the reset output node. The output node control circuit includes a third transistor coupled to the reset output node. At a supply voltage lower than a threshold voltage of the second transistor, the third transistor turns on to pull the reset output node to a logic low. Responsive to the supply voltage exceeding a second threshold level, the third transistor turns off, the first transistor then turns on, and the second transistor turns off to force the output node and the reset input of the load device to a logic high level. The reset output node is thus actively pulled low by the output node control circuit at supply voltages lower than would have permitted the circuit of FIG. 3 to actively pull RESET low.

FIG. 4 shows an example implementation of an SVS 120a. The SVS 120a of FIG. 4 includes a reset generator 402, a driver 405, transistors M1 and M2, and an output node control circuit 410. The reset generator 402 is coupled to a supply voltage node and by which the reset generator receives the supply voltage VDD. As explained above, upon a power-on event, VDD increases from an initial low value (e.g., ground) to a VDD_REGULATED value. The reset generator 402 detects when VDD reaches VDD_REGULATED and asserts a signal to the driver 405. The driver 405 generates control signals CTL1 and CTL2 to selectively turn M1 and M2 off and on, respectively. The node 408 interconnects the drains of M1 and M2 is the output node of the SVS 120a and provides the RESET output signal. As M2's source is connected to the ground node, M2 being on (from a control signal from driver 405) causes node 408 and thus RESET to be pulled low. As M1's source is connected to the supply voltage node (VDD), turning M2 off and M1 on (from a control signal from driver 405) forces RESET to a logic high (VDD). Thus, RESET is as low as ground and as high as VDD. In some examples, VDD may be greater than 5V (e.g., 10V) and thus VDD will be forced to a level of 5V or 10V or whatever the VDD_REGULATED voltage level is.

M1 in this example is a p-type metal oxide semiconductor field effect transistor (PMOS) and M2 is an n-type metal oxide semiconductor field effect transistor (NMOS). In one example, M1 and M2 are drain-extended MOS devices which permits them to operate at heightened supply voltages (e.g., 10V). As drain-extended PMOS and NMOS devices, M1 and M2 have threshold voltages of around 1V (e.g., 0.9V). That being the case, M2 can only be turned on when its gate-to-source voltage is greater than 1V, or whatever is the threshold voltage for M1.

Before VDD reaches VDD_REGULATED but after VDD has reached the threshold voltage of M1, the driver 405 asserts the gate voltage to M2 at a level sufficiently high (e.g., 1V) to turn on M1, thereby pulling RESET to ground. The output node control circuit 410 functions to pull RESET to ground even before VDD reaches the threshold voltage of M1. In one example, the output node control circuit 410 pulls RESET low when VDD reaches a voltage as low as 0.3V, and thus the VPOR in that example is 0.3V.

The output node control circuit 410 includes an inverter 412, a capacitor C1, resistors R1, R2, R3, and R4, and transistors M3, M4, M5, M6, and M7. The control signal (CTLS2) from the driver 405 to the gate of M2 also is provided to an input of inverter 412. The output signal 413 of inverter 412 is coupled to the gate of M4 and thus the output signal 413 of inverter 412 controls the on/off state of M4. The resistors R1-R4 are connected in series between the supply voltage node VDD and node N1. Node N1 is a node that interconnects the drain of M4, the drain and gate of M7, capacitor C1, and the gates of M3 and M5. The other terminal of C1 is connected to the supply voltage node VDD. The sources of M3, M4 and M7 are connected to the ground node. M3, M5, and M6 are connected in series between the ground node and the SVS's output node 408, which provides the RESET output signal. The drain of M3 is connected to the source of M5, and the drain of M5 is connected to the source of M6. The drain of M6 is connected to the output node 408. The gate of M6 is connected to a node 417 between resistors R2 and R3. In some implementations, all four resistors are configured to have the same resistance value, and thus, these resistors function as a voltage divider such that the voltage on node 417 is approximately one-half of VDD. The gate of M5 is connected to the gate of M3 and thus to node N1.

In the example of FIG. 4, each of M3-M7 is implemented as an NMOS transistor, but can be implemented as other types of transistors in other examples. At steady state (e.g., following a power-on event), VDD (e.g., 10V) is applied to the drain of M4, and the source of M4 is at ground. To avoid damage to M4 due to such higher voltage levels, M4 is implemented as a drain-extended NMOS transistor which has a relatively high breakdown voltage. Similarly, M7 also may be implemented as a drain-extended NMOS transistor. As drain-extended devices, the threshold voltage for M4 and M7 may be approximately 1V. In some examples, M5 and M6 comprise natural transistors (also referred to as native transistors), but could also comprise depletion mode transistors. A natural transistor is one which the threshold voltage is negative or approximately zero. M3 is implemented as a low voltage transistor (e.g., a 1.8V transistor) meaning that the voltage across any two of its gate, drain, or source terminals should not exceed 1.8V. The threshold voltage for M3 is relatively low as well, for example, 180 mV.

Figure 5:
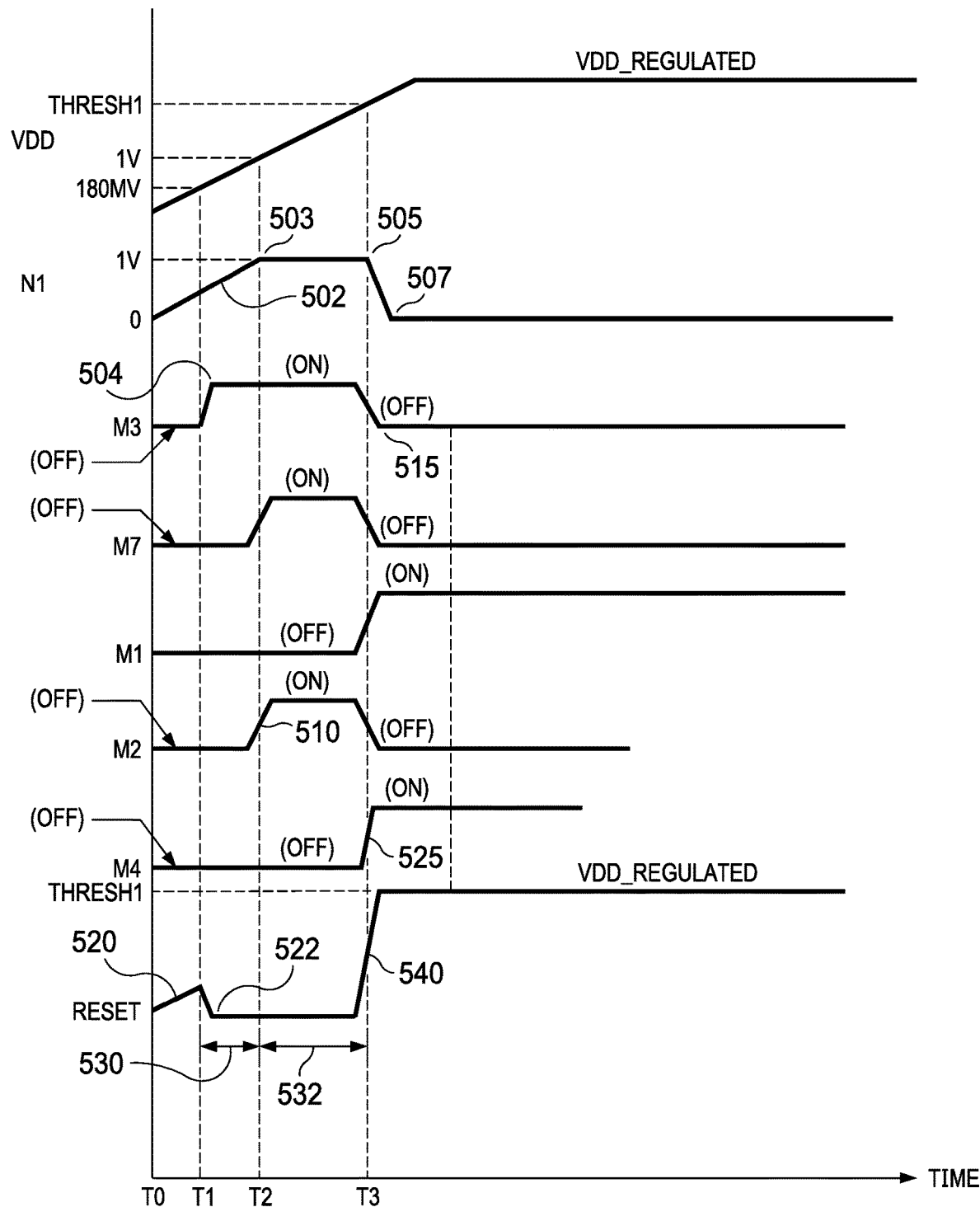
FIG. 5 includes a timing diagram of signals and transistor states within the circuit of FIG. 4.

The operation of the output node control circuit 410 to control the RESET signal is illustrated with the timing diagram of FIG. 5 in conjunction with the schematic of FIG. 4. FIG. 5 illustrates the transient response of VDD as it increases at the beginning of a power-on event (initiated at time T0) to its regulated value VDD_REGULATED. The waveform for N1 provides the voltage on node N1. The waveforms for M3, M7, M1, M2, and M4 show the on/off states of the transistors, and the waveform for RESET shows the voltage waveform on the output node 408. Three example threshold voltages are shown in FIG. 5—180 mV, 1V, and THRESH1. THRESH1 is the VDD voltage at which the reset generator 402 turns M1 on and M2 off to force RESET to be high. The threshold level 180 mV is an example of the threshold voltage for transistor M3. The threshold level 1 V is an example of the threshold voltage for the drain-extended NMOS transistor M7 as well as for M4.

With M5 and M6 comprising natural transistors (and their on/off status is not shown in FIG. 5), M5 and M6 turn on at relatively low voltages at node 417 and N1, respectively (e.g., very shortly after VDD starts to ramp up and at low VDD levels of, for example, less than 20 mV). Transistors M7, M1, M2, and M4 are off initially as shown. Until VDD reaches the 1V threshold voltage associated with M7, M7 remains off. At this point, with no direct coupling of RESET to ground through any of the transistors in FIG. 4, RESET generally tracks VDD in an upward progression as described above and shown at 520 and before time T1.

While M7 is off, current does not flow through resistors R1-R4 and voltage VDD is present on node N1 and thus on the gate of M3. Thus, with VDD increasing the voltage on node N1 increases as well as shown at 502. Once VDD reaches the 180 mV threshold voltage associated with M3, M3 turns on as shown at 504. At that point, all three transistors M3, M5, and M6 are on and RESET is thus pulled low through the series-connected transistors to ground as shown at 522.

Once VDD reaches 1 V, VDD is then high enough for M2 to be turned on, and the driver 405 responds to a signal from the reset generator 402 (which determines that VDD is too low to force RESET high) and asserts a control signal to the gate of M2 to turn on M2 as shown at 510. At that point, both M2 and the series-connected transistor chain of M6, M5, and M3 are both on thereby continuing to pull RESET to a logic low level. During time period 530 (between T1 and T2), VDD is between 180 mV and 1 V. During time period 532 (between T2 and T3), VDD is between 1 V and THRESH1. During time period 530, RESET is low due to M6, M4, and M3 all being on and providing a path from the output node 408 to ground. During time period 530, RESET continues to be low due to both the path to ground through M6/M5/M3 as well as the path to ground through M2.

Node N1 is connected to the gate and drain of M7. Once VDD reaches 1 V, the voltage on N1 also reaches 1 V thereby turning on drain-extended transistor M7. The voltage on node N1 remains constant at 1 V between time points 503 and 505. Transistor M7 thus prevents the gate voltage on low voltage transistor M3 (e.g., 1.8V) from exceeding about 1V providing over-voltage protection to M3.

As M3 is a low voltage device, M3 may be damaged if VDD at a level greater than 1.8V were to be applied to the drain of M3. Thus, when RESET is eventually forced high (VDD) by the reset generator 402 through driver 405, M3 should be turned off when or before M1 is caused to be turned on by the reset generator 403 and driver 405. When the reset generator 402 determines that VDD has reached THRESH1, the reset generator 402 asserts a signal(s) to the driver 405 to turn off M2 and turn on M1. Turning on M1 causes RESET to be forced high as shown at 540. RESET increases until VDD_REGULATED is reached and RESET remains at approximately VDD_REGULATED as shown.

The same gate control signal used to turn M2 off is inverted by inverter 412. Thus, with the control signal to M2 being low to turn off M2, the output signal 413 of inverter becomes high thereby turning on M4 as shown at 525 in FIG. 5. With M4 on, the voltage on node N1 is pulled low to ground as shown at 507. Node N1 voltage being low causes M3 to be turned off as illustrated at 515. The gate of M5 also is connected to node N1 and thus M5 also is turned off when M3 is turned off thereby providing over-voltage protection to low voltage device M3 in addition to that provided by M7 as described above.

The gate of M6 is controlled by the voltage at node 417. With the sum of the resistance values of R1 and R2 being approximately equal to the sum of the resistance values of R3 and R4, the voltage on node 417 will increase to a maximum value of about one-half of VDD_REGULATED. If VDD_REGULATED is 10 V, then the voltage on node 417 will be 5 V, and thus the voltage on the drain of M5 will not exceed 5V (or whatever the voltage on node 417 becomes). M5's drain does not receive the full VDD_REGULATED voltage. The drain of M5 is connected to the source of M6. When the voltage on the source of M6 equals the voltage on the gate of M6, the gate-to-source voltage of M6 becomes 0V and M6 turns off thereby preventing the voltage on the drain of M5 from ever reaching the full VDD_REGULATED voltage. Thus, M6 provides some over-voltage protection for M5, and M5 provides over-voltage protection for M3.

Capacitor C1 is connected between the supply voltage node VDD and node N1, and thus to the gate of M3. Capacitor C1 AC-couples the supply voltage node VDD to M3 to more quickly turn on M3 when VDD reaches 180 mV than would be the case absent C1.

Figure 6:
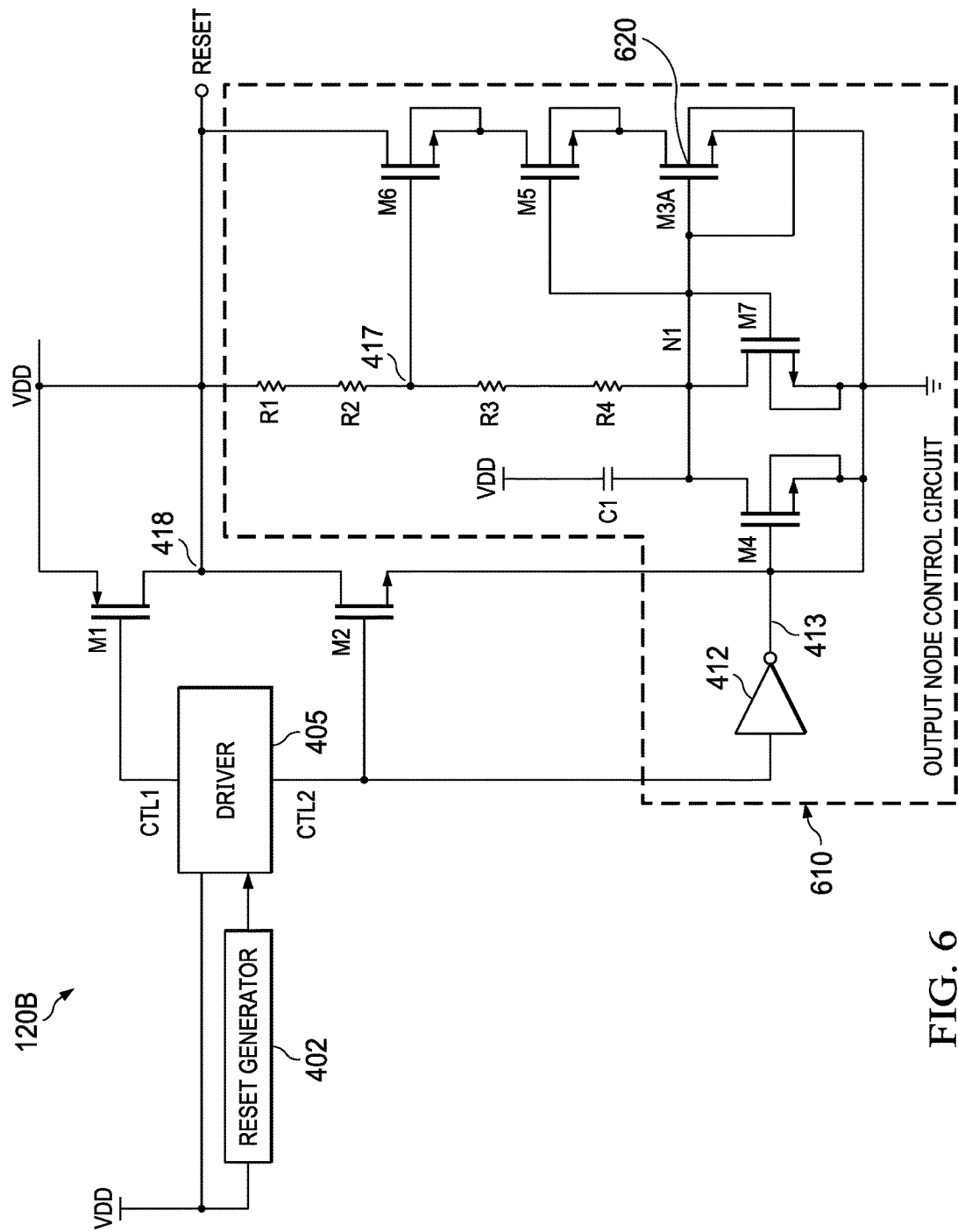
FIG. 6 shows yet another circuit of a portion of the supply voltage supervisor.

FIG. 6 shows another example of an SVS 120b. The example of FIG. 6 also includes the reset generator 402, driver 405 and transistors M1 and M2. FIG. 6 further includes a output node control circuit 610 which is largely the same as the output node control circuit 410 of FIG. 4. One difference between the two output node control circuits is that in FIG. 4, the body connections for transistors M3-M7 are connected to the sources of the respective transistors. However, in FIG. 6, the body connection for M3A is connected to its gate instead. The body connections of the remaining transistors in the output node control circuit 610 (transistors M4-M7 are connected to their sources). By connecting M3A's body to its gate, the body terminal of M3A will be positively biased as VDD starts to increase during a power-on event. As such, all else being equal, M3A in FIG. 6 will turn on at a lower voltage than M3 in FIG. 4, thereby further reducing the maximum level that RESET will experience before the reset generator 402 turns M1 to force RESET high. The VPOR of the example of FIG. 6 will be lower than the VPOR of FIG. 4.

Figure 7:
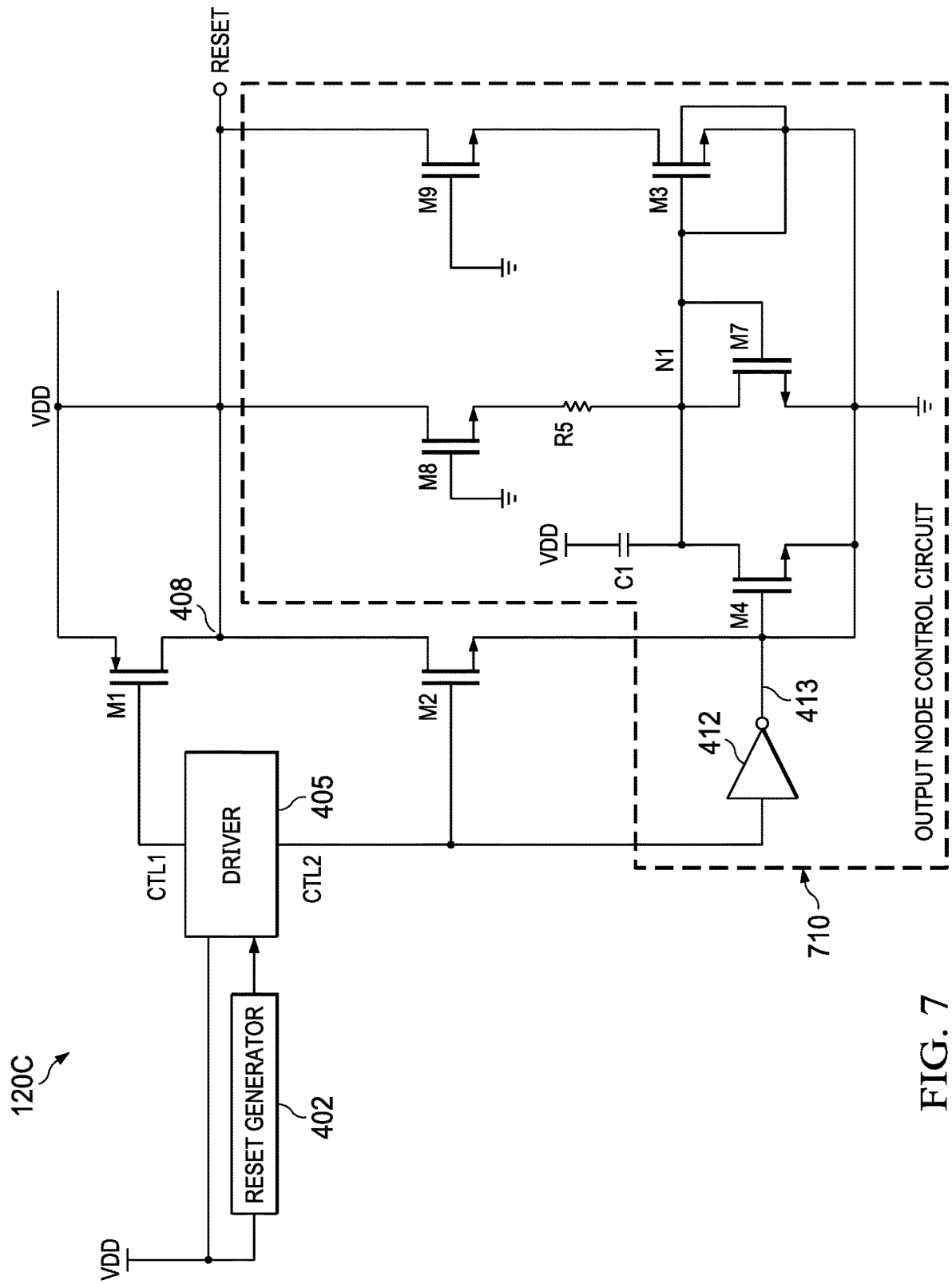
FIG. 7 shows still another circuit of a portion of the supply voltage supervisor.

FIG. 7 shows another example of an SVS 120c. The example of FIG. 7 also includes the reset generator 402, driver 405 and transistors M1 and M2. FIG. 7 further includes an output node control circuit 710 which is similar to the output node control circuit 410 of FIG. 4. One difference is that a resistor R5 is included instead of series-connection of resistors (although resistor R5 itself could be implemented as multiple resistors in series. Transistor M9 connects to the output node 408 and the transistor M3 (which may have its body connected to its gate as shown, or have its body connected to its source). Further, transistor M8 connects between VDD and R5. Transistors M8 and M9 are implemented in this example as junction field effect transistors (JFETs) or as depletion mode MOS transistors. M8 and M9 have negative threshold voltages (e.g., −1.5V) which means that M8 and M9 will turn-off once their gate-to-source voltage reaches −1.5V or lower (note that −2V is lower than −1.5V). With the gates f M8 and M9 connected to ground, the source voltage for M8 and M9 can rise to as high as 1.5V, as otherwise M8 and M9 will turn off for larger voltages.

M9 protects M3 and since M9's gate is biased to ground, a resistor divider is not needed. M8 limits the current through R5 resistor by limiting the voltage across R5. M8 will limit the voltage to, for example, 1.5V across R5. In an implementation lacking M8, R5 will see the full voltage on VDD (e.g., 10V) across the resistor.

Figure 8:
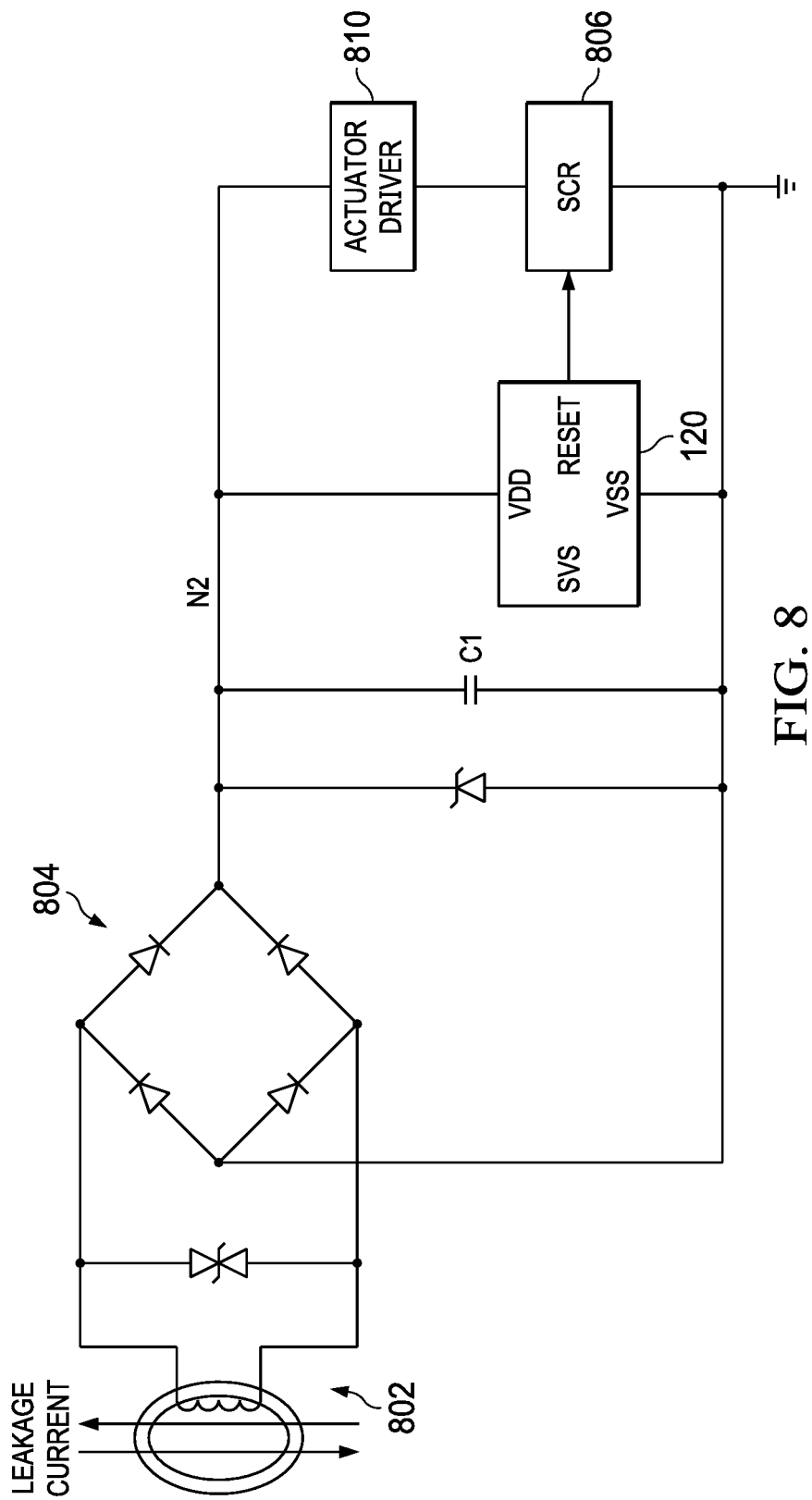
FIG. 8 shows an example use of the supply voltage supervisor in conjunction with a solid-state circuit breaker.

FIG. 8 shows an example of a circuit breaker 800 to which the SVS 120 described herein can be used. Leakage current is the differential current in a circuit being protected (e.g., in a home) due to a short-circuit. The leakage current is "stepped-up" via transformer. A full-wave rectifier 804 rectifies the stepped-up current and charges capacitor C1 to thereby convert alternating current (AC) current to a direct current (DC) voltage. The voltage across C1 (voltage on node N2) is thus generated based on the magnitude of the leakage current. The voltage on node N2 is monitored by SVS 120 on its VDD input. As the voltage on node N2 increases above a threshold set internal to the SVS 120 (and described above), the RESET output signal from the SVS toggles state (e.g., a low to high transition). A silicon-controlled rectifier (SCR) 806 turns on in response to a sufficiently high level of RESET. When on, the SCR 806 then asserts a signal to an actuator driver 810, which then asserts a signal to an actuator (not shown) to disable (trip) the circuit experiencing the current overload condition.

In this description, the term "couple" or "couples" means either an indirect or direct connection. Thus, if a first device couples to a second device, that connection may be through a direct connection or through an indirect connection via other devices and connections. Modifications are possible in the described embodiments, and other embodiments are possible and within the scope of the claims.

What is claimed is:

1. A circuit, comprising:
   a first transistor including a first control input and first and second current terminals, the first current terminal coupled to a supply voltage node;
   a second transistor including a second control input and third and fourth current terminals, the third current terminal coupled to the second current terminal at an output node and the fourth current terminal coupled to a ground node;
   a third transistor including a third control input and fifth and sixth current terminals, the fifth current terminal coupled to the output node and the sixth current terminal coupled to the ground node;
   a fourth transistor including a fourth control input and seventh and eighth current terminals, the eighth current terminal coupled to the ground node and the seventh current terminal coupled to the third control input;
   an inverter having an input and an output, the input of the inverter coupled to the second control input, and the output of the inverter coupled to the fourth control input, and
   a driver to assert a first control signal to the first control input, and to assert a second control signal, of opposite polarity as the first control signal, to the second control input.

2. The circuit of claim 1, further comprising a transistor coupled between the fifth current terminal and the output node.

3. The circuit of claim 1, further comprising:
   a fifth transistor including a fifth control input and ninth and tenth current terminals, the fifth control input coupled to the third control input and to the seventh current terminal, the tenth current terminal coupled to the fifth current terminal;
   a sixth transistor including a sixth control input and eleventh and twelfth current terminals, the twelfth current terminal coupled to the ninth current terminal and the eleventh current terminal coupled to the output node.

4. The circuit of claim 3, further comprising a voltage divider coupled between the supply voltage node and a first node coupling the third and fifth control inputs and the seventh current terminal, wherein a second node within the voltage divider is coupled to the sixth control input.

5. The circuit claim 1, further comprising a seventh transistor including a seventh control input and thirteenth and fourteenth current terminals, each of the seventh control input and the thirteenth current terminal coupled to the third control input and to the seventh current terminal.

6. The circuit of claim 1, further comprising a capacitive device coupled between the supply voltage node and the seventh current terminal.

7. The circuit of claim 1, wherein the third transistor includes a body terminal coupled to the third control input.

8. The circuit of claim 1, further comprising a junction field effect transistor coupled to the output node and to the fifth current terminal.

9. A circuit, comprising:
   a push-pull circuit comprising a first transistor coupled to a second transistor, the first transistor including a first control input and first and second current terminals, the first current terminal coupled to a supply voltage node, and the second transistor including a second control input and third and fourth current terminals, the third current terminal coupled to the second current terminal at an output node and the fourth current terminal coupled to a ground node; and
   an output node control circuit coupled to the push-pull circuit, the output node control circuit including a third transistor coupled to the output node and to the ground node, wherein when a supply voltage on the supply voltage node is lower than a first threshold voltage of the second transistor, the third transistor is to turn on to pull the output node to a logic low, and wherein responsive to the supply voltage exceeding a second threshold level, the third transistor is to be turned off and the first transistor is to be turned on and the second transistor is to be turned off to force the output node to a logic high,
   wherein the third transistor has a body terminal that is coupled to a control input of the third transistor.

10. The circuit of claim 9, wherein the output node control circuit comprise a fourth transistor including one current terminal coupled to the ground node and another current terminal coupled to a control input of the third transistor, wherein the fourth transistor includes a control input that is to be asserted to turn on the fourth transistor responsive to the supply voltage exceeding the second threshold level.

11. The circuit of claim 10, further comprising an inverter having an input and an output, the input of the inverter coupled to the second control input and the output of the inverter coupled to the control input of the fourth transistor.

12. The circuit of claim 9, wherein the third transistor has a control input that is AC-coupled to the supply voltage node.

13. The circuit of claim 9, further comprising a fifth transistor that is to be turned on upon the third transistor being turned on, the fifth transistor being on causing a control input of the third transistor to be a logic low.

14. The circuit of claim 13, further comprising a device coupled between the third transistor and the output node, the device configured to prevent a voltage on a current terminal of the third transistor relative to any other terminal of the third transistor from exceeding a voltage rating of the third transistor.

* * * * *